(12) United States Patent
Iwaya et al.

(10) Patent No.: US 10,403,713 B2
(45) Date of Patent: Sep. 3, 2019

(54) METHOD OF MANUFACTURING SEMICONDUCTOR DEVICE

(71) Applicant: FUJI ELECTRIC CO., LTD., Kawasaki-shi, Kanagawa (JP)

(72) Inventors: Masanobu Iwaya, Matsumoto (JP); Akimasa Kinoshita, Matsumoto (JP); Shinsuke Harada, Tsukuba (JP); Yasunori Tanaka, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/294,190

(22) Filed: Mar. 6, 2019

(65) Prior Publication Data

US 2019/0206985 A1     Jul. 4, 2019

Related U.S. Application Data

(60) Division of application No. 15/909,977, filed on Mar. 1, 2018, now Pat. No. 10,276,653, which is a
(Continued)

(30) Foreign Application Priority Data

Oct. 16, 2015   (JP) ................. 2015-204669

(51) Int. Cl.
*H01L 29/78*     (2006.01)
*H01L 29/06*     (2006.01)
(Continued)

(52) U.S. Cl.
CPC .......... *H01L 29/063* (2013.01); *H01L 21/046* (2013.01); *H01L 29/1095* (2013.01);
(Continued)

(58) Field of Classification Search
None
See application file for complete search history.

(56) References Cited

U.S. PATENT DOCUMENTS 6,180,958 B1    1/2001  Cooper, Jr.
9,142,668 B2 *  9/2015  Cheng ................ H01L 29/7827
(Continued)

FOREIGN PATENT DOCUMENTS

JP    2009-259896 A    11/2009
JP    2009-260253 A    11/2009
(Continued)

*Primary Examiner* — Jack S Chen
(74) *Attorney, Agent, or Firm* — Rabin & Berdo, P.C.

(57) ABSTRACT

In a first main surface of a silicon carbide semiconductor base, a trench is formed. On a first main surface side of the silicon carbide semiconductor base, an n-type silicon carbide epitaxial layer is deposited. In a surface of the n-type silicon carbide epitaxial layer, an n-type high-concentration region is provided. In the surface of the n-type silicon carbide epitaxial layer, a first p-type base region and a second $p^+$-type base region are selectively provided. The second $p^+$-type base region is formed at the bottom of the trench. A depth of the n-type high-concentration region is deeper than that of the first p-type base region and the second $p^+$-type base region. Thus, by an easy method, the electric field at a gate insulating film at the bottom of the trench is mitigated, enabling the breakdown voltage of the active region to be maintained and the ON resistance to be lowered.

7 Claims, 5 Drawing Sheets

Related U.S. Application Data continuation of application No. PCT/JP2016/076418, filed on Sep. 8, 2016.

(51) Int. Cl.
*H01L 29/16* (2006.01)
*H01L 21/04* (2006.01)
*H01L 29/10* (2006.01)
*H01L 29/66* (2006.01)

(52) U.S. Cl.
CPC .... H01L 29/1608 (2013.01); H01L 29/66068 (2013.01); H01L 29/7813 (2013.01)

(56) References Cited

U.S. PATENT DOCUMENTS

| | | |
|---|---|---|
| 10,276,653 B2 * | 4/2019 | Iwaya .................. H01L 21/046 |
| 2009/0280609 A1 | 11/2009 | Akiba et al. |
| 2011/0024831 A1 | 2/2011 | Nakano |
| 2012/0037920 A1 | 2/2012 | Treu et al. |
| 2014/0264564 A1 | 9/2014 | Cheng et al. |
| 2016/0247910 A1 | 8/2016 | Suzuki et al. |

FOREIGN PATENT DOCUMENTS

| | | |
|---|---|---|
| JP | 5539931 B2 | 7/2014 |
| JP | 2015-072999 A | 4/2015 |

* cited by examiner

METHOD OF MANUFACTURING SEMICONDUCTOR DEVICE

CROSS REFERENCE TO RELATED APPLICATIONS

This is a divisional of U.S. application Ser. No. 15/909,977, filed on Mar. 1, 2018, and allowed on Dec. 14, 2018, which is a continuation application of International Application PCT/JP2016/076418, filed on Sep. 8, 2016, which claims priority from a Japanese Patent Application No. 2015-204669 filed on Oct. 16, 2015. The contents of each of the identified applications are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, to reduce the ON resistance of an element in a power semiconductor device, a vertical metal oxide semiconductor field effect transistor (MOSFET) having a trench structure is produced. In the vertical MOSFET, the trench structure in which a channel is formed orthogonally to a substrate surface enables the cell density per unit area to be increased more easily as compared to a planar structure in which the channel is formed parallel to the substrate surface. Therefore, with the trench structure, the current density per unit area may be increased more than with a planar structure and in terms of cost, this is advantageous.

Nonetheless, the vertical MOSFET having the trench structure has a structure in which an entire region of the inner walls of the trench is covered by a gate insulating film to form a channel in an orthogonal direction. A portion of the gate insulating film at a bottom of the trench is near a drain electrode and therefore, this portion of the gate insulating film is easily subjected to high electric field. In particular, since ultrahigh voltage elements are produced with a wide bandgap semiconductor material (semiconductor material having a wider bandgap than that of silicon such as silicon carbide (SiC)), adverse effects on the gate insulating film at the bottom of the trench significantly reduce reliability.

As a method to resolve such problems, a structure has been proposed in which a p-type region is formed that contacts a p-type base region and reaches a position that is deeper than that of the bottom of the trench whereby a pn junction is formed at a position deeper than that of the bottom of the trench and near the trench to thereby mitigate the electric field strength at the bottom of the trench (for example, refer to Japanese Patent No. 5539931). Further, a structure has been proposed in which a p-type region is formed at the bottom of the trench (for example, refer to U.S. Pat. No. 6,180,958). Further, a structure formed using both of these structures has been proposed (for example, refer to Japanese Laid-Open Patent Publication No. 2009-260253 (FIG. 7)).

SUMMARY OF THE INVENTION

According to an embodiment of the present invention, a semiconductor device includes a wide bandgap semiconductor substrate of a first conductivity type and containing a semiconductor material having a bandgap wider than that of silicon, and a first wide bandgap semiconductor layer of the first conductivity type formed on a front surface of the wide bandgap semiconductor substrate. An impurity concentration of the first wide bandgap semiconductor layer of the first conductivity type is lower than that of the wide bandgap semiconductor substrate. The semiconductor device further includes a first base region of a second conductivity type selectively formed in a surface layer on a side of the first wide bandgap semiconductor layer of the first conductivity type, opposite a wide bandgap semiconductor substrate side, a second base region of the second conductivity type selectively formed in the first wide bandgap semiconductor layer of the first conductivity type, and a region of the first conductivity type selectively formed in a surface layer on the side of the first wide bandgap semiconductor layer of the first conductivity type, opposite the wide bandgap semiconductor substrate side. An impurity concentration of the region of the first conductivity type is higher than that of the first wide bandgap semiconductor layer of the first conductivity type.

The semiconductor device further includes a wide bandgap semiconductor layer of the second conductivity type formed on a surface of the first wide bandgap semiconductor layer of the first conductivity type, on the side of the first wide bandgap semiconductor layer of the first conductivity type, opposite the wide bandgap semiconductor substrate side, the wide bandgap semiconductor layer of the second conductivity type containing a semiconductor material having a bandgap wider than that of silicon, a source region of the first conductivity selectively formed in the wide bandgap semiconductor layer of the second conductivity type, and a trench penetrating the wide bandgap semiconductor layer of the second conductivity type and reaching the region of the first conductivity type. The semiconductor device further includes a gate electrode formed in the trench via a gate insulating film, an interlayer insulating film formed on the gate electrode, a source electrode in contact with the wide bandgap semiconductor layer of the second conductivity type and the source region of the first conductivity, and a drain electrode provided on a rear surface of the wide bandgap semiconductor substrate of the first conductivity type. A depth of the region of the first conductivity type is deeper than a depth of the first base region of the second conductivity type and the second base region of the second conductivity type. A width of the second base region is a same or wider width than that of the trench.

In the embodiment, the depth of the region of the first conductivity type is deeper than the depth of the first base region of the second conductivity type and the second base region of the second conductivity type by 0.2 μm to 0.5 μm.

In the embodiment, the semiconductor material having a bandgap wider than that or silicon is silicon carbide.

In the embodiment, a part of the first base region of the second conductivity type is connected to the second base region of the second conductivity type.

According to another embodiment of the invention, a method of manufacturing a semiconductor device includes forming a first wide bandgap semiconductor layer of a first conductivity type on a front surface of a wide bandgap semiconductor substrate of the first conductivity type containing a semiconductor material having a bandgap wider than that of silicon. An impurity concentration of the first wide bandgap semiconductor layer of the first conductivity type is lower than that of the wide bandgap semiconductor substrate.

The method further includes selectively forming a first base region of a second conductivity type and a second base region of the second conductivity type in a surface layer of the first wide bandgap semiconductor layer of the first conductivity type, forming a first region of the first conductivity in the surface layer of the first wide bandgap semiconductor layer of the first conductivity type, the first region of the first conductivity formed deeper than the first base region of the second conductivity type and the second base region of the second conductivity type, and forming a second wide bandgap semiconductor layer of the first conductivity type in a surface of the first wide bandgap semiconductor layer of the first conductivity type. The second wide bandgap semiconductor layer of the first conductivity type contains a semiconductor material having a bandgap wider than that of silicon, and an impurity concentration of the second wide bandgap semiconductor layer of the first conductivity type is lower than that of the wide bandgap semiconductor substrate.

The method further includes selectively forming a third base region of the second conductivity type in a surface layer of the second wide bandgap semiconductor layer of the first conductivity type. The third base region of the second conductivity type is in contact with the first base region of the second conductivity type. The method further includes forming a wide bandgap semiconductor layer of the second conductivity type in a surface of the second wide bandgap semiconductor layer of the first conductivity type, the wide bandgap semiconductor layer of the second conductivity type containing a semiconductor material having a bandgap wider than that of silicon, selectively forming a source region of the first conductivity in the wide bandgap semiconductor layer of the second conductivity type, and forming a trench penetrating the source region of the first conductivity and the wide bandgap semiconductor layer of the second conductivity type and reaching the first region of the first conductivity.

The method further includes forming a gate electrode in the trench via a gate insulating film, forming an interlayer insulating film on the gate electrode, forming a source electrode in contact with the wide bandgap semiconductor layer of the second conductivity type and the source region of the first conductivity, and forming a drain electrode on a rear surface of the wide bandgap semiconductor substrate.

In the embodiment, the method further includes selectively forming a second region of the first conductivity type in the surface layer of the second wide bandgap semiconductor layer of the first conductivity type. The second region of the first conductivity type is in contact with the first region of the first conductivity and is formed after formation of the third base region of the second conductivity type and before formation of the wide bandgap semiconductor layer of the second conductivity type.

In the embodiment, the second region of the first conductivity type is formed by ion implantation.

In the embodiment, the second wide bandgap semiconductor layer of the first conductivity type is formed to have an impurity concentration that is higher than that of the first wide bandgap semiconductor layer of the first conductivity type.

In the embodiment, the first wide bandgap semiconductor layer of the first conductivity type, the second wide bandgap semiconductor layer of the first conductivity type, and the wide bandgap semiconductor layer of the second conductivity type are formed by epitaxial growth.

In the embodiment, a depth of the first region of the first conductivity is deeper than a depth of the first base region of the second conductivity type and the second base region of the second conductivity type by 0.2 µm to 0.5 µm.

In the embodiment, the semiconductor has a bandgap wider than that of silicon is silicon carbide.

Objects, features, and advantages of the present invention are specifically set forth in or will become apparent from the following detailed description of the invention when read in conjunction with the accompanying drawings.

DETAILED DESCRIPTION OF THE INVENTION

Manufacturing is extremely difficult when a pn junction is formed using the technique in Japanese Patent No. 5539931 because the breakdown voltage cannot be secured when the pn junction is formed at a position deeper than that of the bottom of the trench or a position near the trench. When a p-type region is formed using the technique in U.S. Pat. No. 6,180,958, a high electric field tends to be applied to the gate insulating film on the side wall of the trench and the current path narrows in the ON state, whereby the ON resistance increases. When both a deep p-type region at a position separated from the trench and a p-type region at the bottom of the trench are formed using the technique in Japanese Laid-Open Patent Publication No. 2009-260253, the width of the p-type region at the bottom of the trench is made smaller than the width of the trench to reduce the ON resistance and as a result, the high electric field applied at corner portions of the bottom of the trench is not mitigated.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. Cases where symbols such as n's and p's that include + or − are the same indicate that concentrations are close and therefore, the concentrations are not necessarily equal. In the description of the embodiments below and the accompanying drawings, main portions that are similar will be given the same reference numerals and will not be repeatedly described. Further, in the present description, when Miller indices are described, "−" means a bar added to an index immediately after the "−", and a negative index is expressed by prefixing "−" to the index.

Figure 1:
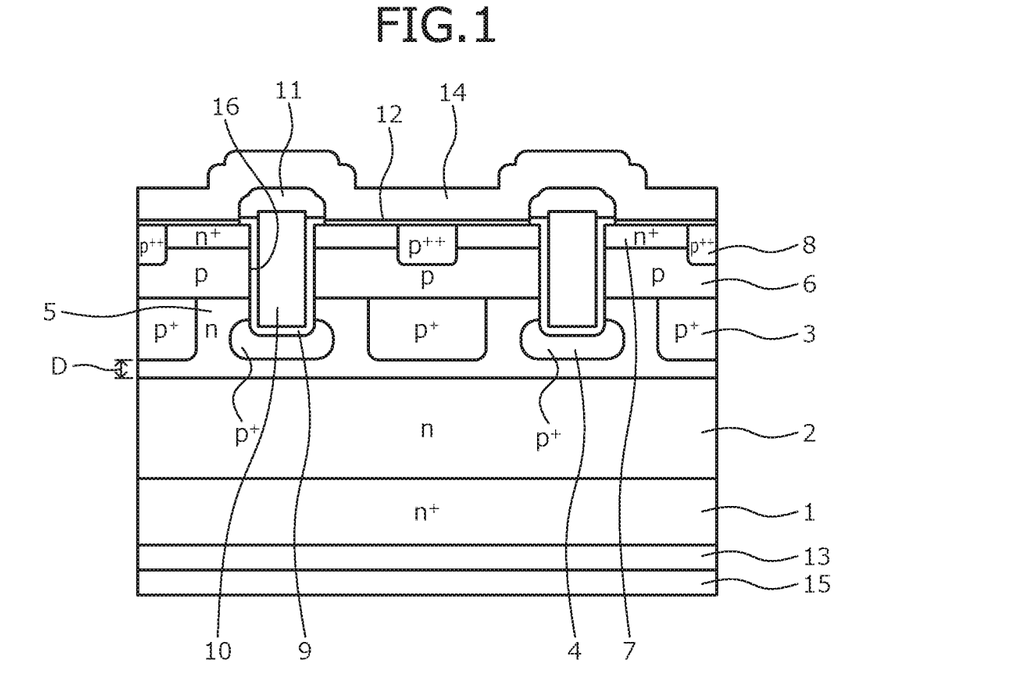
FIG. 1 is a cross-sectional view of a configuration of a silicon carbide semiconductor device according to an embodiment.

The semiconductor device according to the present invention is configured using a wide bandgap semiconductor material. In the embodiments, a silicon carbide semiconductor device produced using, for example, silicon carbide (SiC) as a wide bandgap semiconductor will be described taking a MOSFET as an example. FIG. 1 is a cross-sectional view of a configuration of the silicon carbide semiconductor device according to an embodiment.

As depicted in FIG. 1, in the silicon carbide semiconductor device according to the embodiment, on a first main surface (front surface), e.g., (0001) plane (Si face) of an $n^+$-type silicon carbide substrate (wide bandgap semiconductor substrate of a first conductivity type) 1, an n-type silicon carbide epitaxial layer (first wide bandgap semiconductor layer of the first conductivity type) 2 is deposited.

The $n^+$-type silicon carbide substrate 1 is, for example, a silicon carbide single-crystal substrate doped with nitrogen (N). The n-type silicon carbide epitaxial layer 2 has an impurity concentration that is lower than that of the $n^+$-type silicon carbide substrate 1 and is, for example, a low-concentration n-type drift layer doped with nitrogen. In a surface side of the n-type silicon carbide epitaxial layer 2, opposite the side facing the $n^+$-type silicon carbide substrate 1, an n-type high-concentration region (region of the first conductivity type and having a high impurity concentration) 5 is formed. An impurity concentration of the n-type high-concentration region 5 is lower than that of the $n^+$-type silicon carbide substrate 1 and higher than that of the n-type silicon carbide epitaxial layer 2 and, for example, the n-type high-concentration region 5 is a high-concentration n-type drift layer doped with nitrogen. Hereinafter, the $n^+$-type silicon carbide substrate 1, the n-type silicon carbide epitaxial layer 2, and a p-type base layer (wide bandgap semiconductor layer of the second conductivity type) 6 described hereinafter are collectively regarded as a silicon carbide semiconductor base.

As depicted in FIG. 1, on a second main surface (rear surface, i.e., a rear surface of the silicon carbide semiconductor base) of the $n^+$-type silicon carbide substrate 1, a rear electrode (drain electrode) 13 is provided. The rear electrode 13 constitutes a drain electrode. On the surface of the rear electrode 13, a drain electrode pad 15 is provided.

On the first main surface side (p-type base layer 6 side) of the silicon carbide semiconductor base, a trench structure is formed. In particular, a trench 16 penetrates the p-type base layer 6 from a surface on the side (first main surface side of the silicon carbide semiconductor base) of the p-type base layer 6, opposite the side facing the $n^+$-type silicon carbide substrate 1, and reaches the n-type high-concentration region 5. A gate insulating film 9 is formed along inner walls of the trench 16 and at the bottom and side walls of the trench 16; and on the gate insulating film 9 in the trench 16, a gate electrode 10 is formed. The gate electrode 10 is insulated from the n-type silicon carbide epitaxial layer 2 and the p-type base layer 6 by the gate insulating film 9. The gate electrode 10 may partially protrude from a top (aspect facing toward a source electrode pad 14) of the trench 16 toward the source electrode pad 14.

In a surface layer of the n-type silicon carbide epitaxial layer 2, on the side (first main surface side of the silicon carbide semiconductor base) of n-type silicon carbide epitaxial layer 2 opposite the side facing the $n^+$-type silicon carbide substrate 1, a first $p^+$-type base region (first base region of the second conductivity type) 3 and a second $p^+$-type base region (second base region of the second conductivity type) 4 are selectively provided. The first $p^+$-type base region 3 is separated from the trench 16 and reaches a position that is deeper on the drain side than the bottom of the trench 16. A distance from the first V-type base region 3 to the side walls of the trench 16 is, for example, preferably determined by a JFET (Junction FET) width optimal for the impurity concentrations of the first $p^+$-type base region 3, the second $p^+$-type base region 4, and the n-type high-concentration region 5. The JFET width is a width (distance between the first $p^+$-type base region 3 and the second $p^+$-type base region 4) of a JFET region between the first $p^+$-type base region 3 and the second $p^+$-type base region 4.

The second $p^+$-type base region 4 is formed at a position that faces the bottom of the trench 16 in the depth direction. A width of the second $p^+$-type base region 4 is the same as or wider than that of the trench 16. The bottom of the trench 16 may reach the second $p^+$-type base region 4, or may be position in the n-type high-concentration region 5 between the p-type base layer 6 and the second $p^+$-type base region 4. The first $p^+$-type base region 3 and the second $p^+$-type base region 4, for example, are doped with aluminum (Al). A part of the first $p^+$-type base region 3 may extend on the trench to be connected to the second $p^+$-type base region 4 (see FIG. 9). The reason for this is that holes generated when avalanche breakdown occurs at a junction portion between the second $p^+$-type base region 4 and the n-type silicon carbide epitaxial layer 2 are efficiently migrated to a source electrode 12, reducing the load on the gate insulating film 9 and increasing reliability. FIG. 1 depicts a case where the first $p^+$-type base region 3 and the second $p^+$-type base region 4 are arranged separately from each other (similarly in FIGS. 4 to 8).

On the base first main surface side of the n-type silicon carbide epitaxial layer 2, the p-type base layer (wide bandgap semiconductor layer of the second conductivity type) 6 is provided. The p-type base layer 6 contacts the first $p^+$-type base region 3. An impurity concentration of the p-type base layer 6 may be, for example, lower than the impurity concentration of the first $p^+$-type base region 3, whereby in a base region constituted by the first $p^+$-type base region 3 and the p-type base layer 6, the p-type impurity concentration of a part (the p-type base layer 6) in which an n-type inversion layer (channel) is formed in the ON state may be lowered. Therefore, a gate threshold value Vth, the ON resistance, etc. may be prevented from increasing. Further, the p-type impurity concentration of a part (first $p^+$-type base region 3) on the drain side of the base region may be increased, enabling predetermined breakdown voltage to be secured. In the p-type base layer 6, an $n^+$ source region (source region of the first conductivity) 7 and a $p^{++}$ contact region (contact region of the second conductivity) 8 are selectively provided on a base first main surface side. Further, the $n^+$ source region 7 and the $p^{++}$ contact region 8 contact each other.

The n-type high-concentration region 5 is provided in a region between the first $p^+$-type base region 3 and the second $p^+$-type base region 4 of a surface layer on the base first main surface side of the n-type silicon carbide epitaxial layer 2 and a region between the p-type base layer 6 and the second p+-type base region 4. The n-type high-concentration region 5 is formed to a position deeper than that of the first p+-type base region 3 and the second p+-type base region 4. Therefore, a depth (thickness) of the n-type high-concentration region 5 is greater than a depth (thickness) of the first p+-type base region 3 and a depth (thickness) of the second p+-type base region 4. Further, the first p+-type base region 3 and the second p+-type base region 4 may be formed to a position at a same depth. D is a difference obtained by subtracting the depth of the first p+-type base region 3, the second p+-type base region 4, from the depth of the n-type high-concentration region 5. The n-type high-concentration region 5 may be provided on the drain side of the first V-type base region 3 and the second p+-type base region 4 so as to surround the first p+-type base region 3 and the second p+-type base region 4.

In FIG. 1, while only two trench MOS structures are depicted, more MOS gate (insulated gate constituted by a metal-oxide-semiconductor) structures of a trench structure may be further arranged in parallel.

An interlayer insulating film 11 is provided on the entire first main surface side of the silicon carbide semiconductor base so as to cover the gate electrode 10 embedded in the trench. The source electrode 12 contacts the n+ source region 7 and the p++ contact region 8 via a contact hole opened in the interlayer insulating film 11. The source electrode 12 is electrically insulated from the gate electrode 10 by the interlayer insulating film 11. On the source electrode 12, the source electrode pad 14 is provided.

Figure 2:
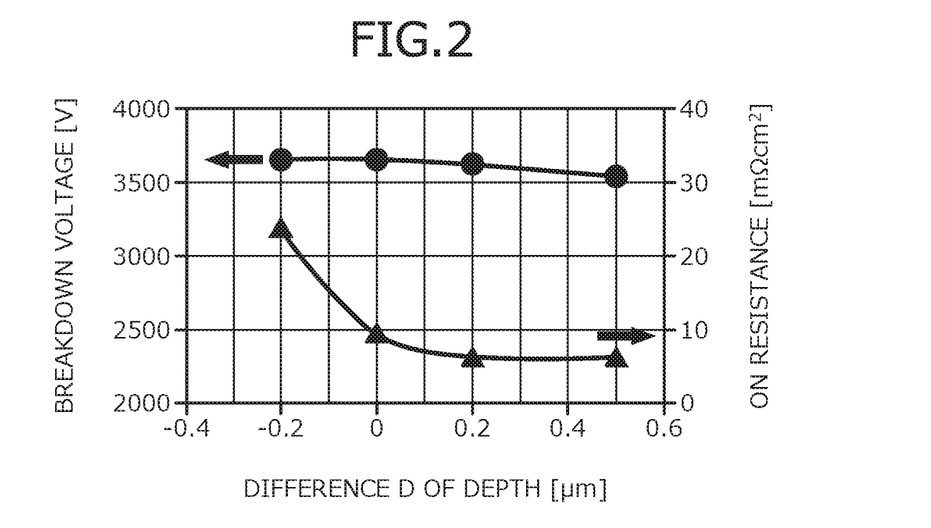
FIG. 2 is a diagram depicting a relationship of ON resistance and breakdown voltage for a depth difference D in the silicon carbide semiconductor device according to the embodiment.

FIG. 2 is a diagram depicting a relationship of the ON resistance and breakdown voltage for the depth difference D in the silicon carbide semiconductor device according to the present embodiment. FIG. 2 depicts the results of verification of the depth of the n-type high-concentration region 5 in a case where in the present embodiment, a 3300V element is assumed as an example. FIG. 2 is a plot (connected triangles) of the ON resistance and a plot (connected black circles) of breakdown voltage, against the difference D obtained by subtracting the depth of the first p+-type base region 3, the second p+-type base region 4, from the depth of the n-type high-concentration region 5. In FIG. 2, a left vertical axis represents breakdown voltage (unit: V), a right vertical axis represents ON resistance (unit: mΩcm$^2$), and a horizontal axis represents the difference D (unit: μm) obtained by subtracting the depth of the first p+-type base region 3, second p+-type base region 4, from the depth of the n-type high-concentration region 5.

When the n-type high-concentration region 5 is shallower than the first p+-type base region 3 and the second p+-type base region 4 (when D is a negative value), the breakdown voltage tends to increase; however, the ON resistance rapidly increases. On the other hand, when the n-type high-concentration region 5 is deeper than the first p+-type base region 3 and the second p+-type base region 4 (when D is a positive value), the breakdown voltage tends to decrease; however, the decrease is not rapid and the breakdown voltage is high and the ON voltage tends to be low. Therefore, the depth of the n-type high-concentration region 5 may be deeper than or equal to the depth of the first p+-type base region 3 and the depth of the second p+-type base region 4 (D≥0.0). Further, the difference D obtained by subtracting the depth of the first p+-type base region 3, second p+-type base region 4, from the depth of the n-type high-concentration region 5 is set to be 0.2 μm or higher, whereby the lowest ON resistance may be substantially maintained. When the difference D obtained by subtracting the depth of the first p+-type base region 3, the second p+-type base region 4, from the depth of the n-type high-concentration region 5 exceeds 0.5 μm, the predetermined breakdown voltage (3300V) becomes difficult to realize. As a result, it was found that, preferably, the difference D obtained by subtracting the depth of the first p+-type base region 3, the second p+-type base region 4, from the depth of the n-type high-concentration region is suitable within a range from 5 0.2 μm to 0.5 μm (0.2≤D≤0.5).

A method of manufacturing the silicon carbide semiconductor device according to the present embodiment will be described. FIGS. 3, 4, 5, 6, 7, and 8 are cross-sectional views of the silicon carbide semiconductor device according to the present embodiment during manufacture.

Figure 3:
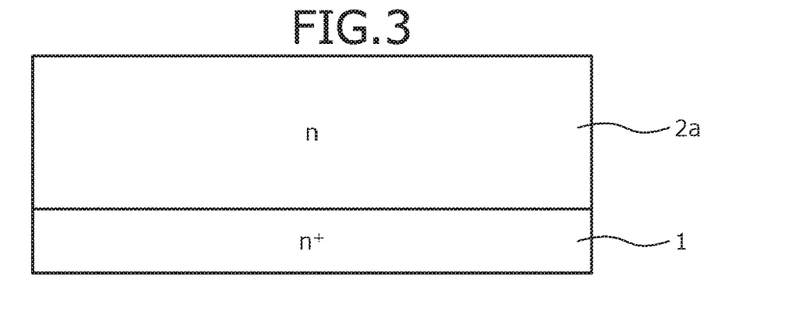
FIG. 3 is a cross-sectional view (part 1) of the silicon carbide semiconductor device according to the embodiment during manufacture.

As depicted in FIG. 3, the n+-type silicon carbide substrate 1 containing an n-type silicon carbide is prepared. On the first main surface of the n+-type silicon carbide substrate 1, a first n-type silicon carbide epitaxial layer (first wide bandgap semiconductor layer of the first conductivity type) 2a containing a silicon carbide is formed by epitaxial growth to a thickness of, for example, about 30 μm while an n-type impurity, e.g., nitrogen atoms, is doped. The first n-type silicon carbide epitaxial layer 2a forms the n-type silicon carbide epitaxial layer 2. The state up to here is depicted in FIG. 3.

Figure 4:
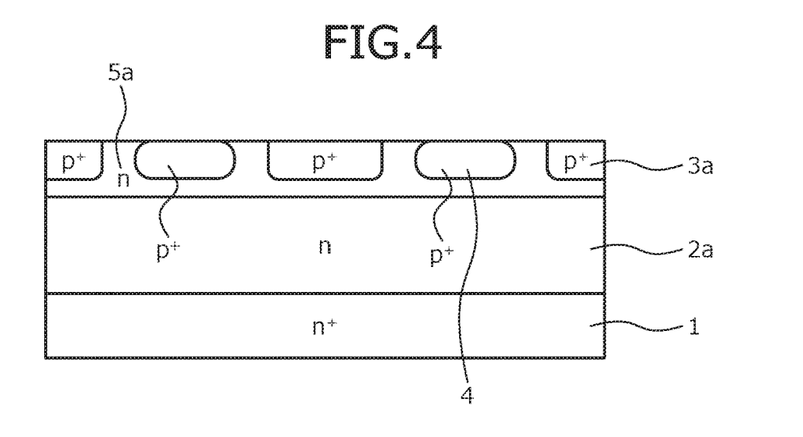
FIG. 4 is a cross-sectional view (part 2) of the silicon carbide semiconductor device according to the embodiment during manufacture.

Next, as depicted in FIG. 4, on the surface of the first n-type silicon carbide epitaxial layer 2a, by photolithography, a mask (not depicted) having predetermined openings is formed using, for example, an oxide film. A p-type impurity, e.g., aluminum atoms, is ion implanted using the oxide film is used as a mask. As a result, in parts of a surface region of the first n-type silicon carbide epitaxial layer 2a, for example, the second p+-type base region (second semiconductor region of the second conductivity) 4 and a first p-type region (first semiconductor region of the second conductivity) 3a are formed at a depth of about 0.5 μm, for example, so that a distance between the adjacent first p-type region 3a and second p+-type base region 4 is about 1.5 μm. A dose amount at the time of ion implantation for forming the first p-type regions 3a and the second p+-type base regions 4, for example, may be set such that the impurity concentration becomes about 5×10$^{18}$/cm$^3$.

Next, the mask used in the ion implantation for forming the first p-type regions 3a and the second p+-type base regions 4n is removed. Subsequently, an n-type impurity, e.g., nitrogen atoms, is ion implanted. As a result, as depicted in FIG. 4, a first n-type region (first region of the first conductivity) 5a is formed to a position deeper than the first p-type region 3a and the second p+-type base region 4 by 0.2 to 0.5 μm, between the first p-type region 3a and second p+-type base region 4 of the surface layer of the first n-type silicon carbide epitaxial layer 2a. Here, ion implantation for forming the first n-type region 5a is performed without using a mask, whereby in the entire surface layer of the first n-type silicon carbide epitaxial layer 2a, the first n-type region 5a is formed so as to surround lower sides (sides facing toward the n+-type silicon carbide substrate 1) of the first p-type region 3a and the second p+-type base region 4. A dose amount of the ion implantation for forming the first n-type region 5a, for example, may be set such that the impurity concentration becomes about 5×10$^{16}$/cm$^3$. The state up to here is depicted in FIG. 4.

Figure 5:
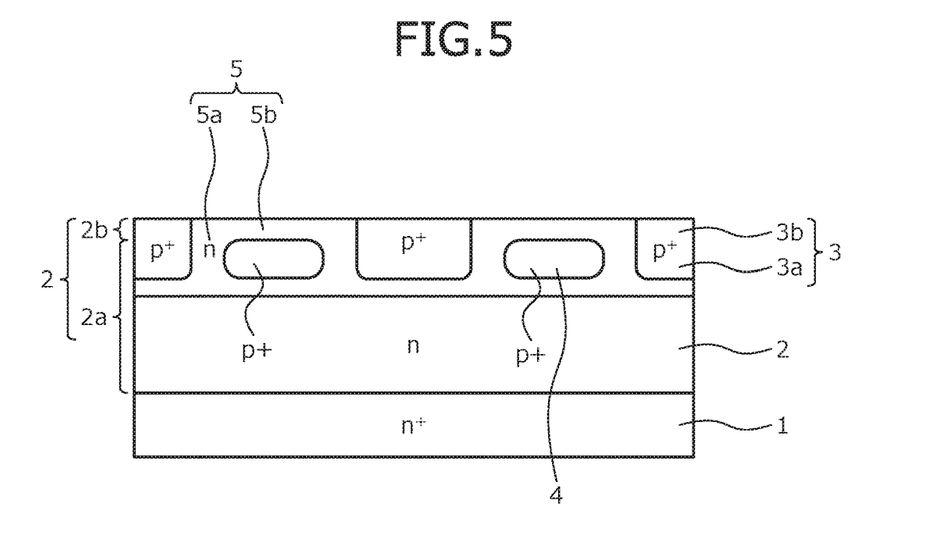
FIG. 5 is a cross-sectional view (part 3) of the silicon carbide semiconductor device according to the embodiment during manufacture.

Next, as depicted in FIG. 5, on the surface of the first n-type silicon carbide epitaxial layer 2a, while an n-type impurity, e.g., nitrogen atoms, is doped, a second n-type silicon carbide epitaxial layer (second wide bandgap semiconductor layer of the first conductivity type) 2b is formed by epitaxial growth so that, for example, a thickness thereof is about 0.5 μm. The second n-type silicon carbide epitaxial layer 2b and the first n-type silicon carbide epitaxial layer 2a are collectively the n-type silicon carbide epitaxial layer 2. Conditions of the epitaxial growth for forming the second n-type silicon carbide epitaxial layer 2b, for example, may be set so that the impurity concentration of the second n-type silicon carbide epitaxial layer 2b becomes about $3 \times 10^{15}/\text{cm}^3$.

Next, on the surface of the n-type silicon carbide epitaxial layer 2, by photolithography, a mask (not depicted) having predetermined openings is formed using, for example, an oxide film. A p-type impurity, e.g., aluminum atoms, is ion implanted using the oxide film as a mask. As a result, as depicted in FIG. 5, in parts of the surface layer of the n-type silicon carbide epitaxial layer 2, a second p-type region (third semiconductor region of the second conductivity type) 3b at a depth of, for example, about 0.5 μm is formed so that, for example, each overlaps the top of a first p-type region 3a. The second p-type regions 3b and the first p-type regions 3a are collectively the first $p^+$-type base regions 3. A dose amount at the time of the ion implantation for forming the second p-type regions 3b, for example, may be such that the impurity concentration becomes about $5 \times 10^{18}/\text{cm}^3$.

Next, the mask used in the ion implantation for the second p-type regions 3b is removed. Subsequently, an n-type impurity, e.g., nitrogen atoms, is ion implanted. As a result, as depicted in FIG. 5, in parts of the surface layer of the second n-type silicon carbide epitaxial layer 2b, a second n-type region (second region of the first conductivity type) 5b at a depth of, for example, about 0.5 μm is formed so as to contact the first p-type regions 3a, the second $p^+$-type base regions 4, and the first n-type regions 5a. A dose amount at the time of ion implantation for the second n-type regions 5b, for example, may be set so that the impurity concentration becomes about $5 \times 10^{16}/\text{cm}^3$. The second n-type regions 5b and the first n-type regions 5a are collectively the n-type high-concentration regions 5. The state up to here is depicted in FIG. 5.

Figure 6:
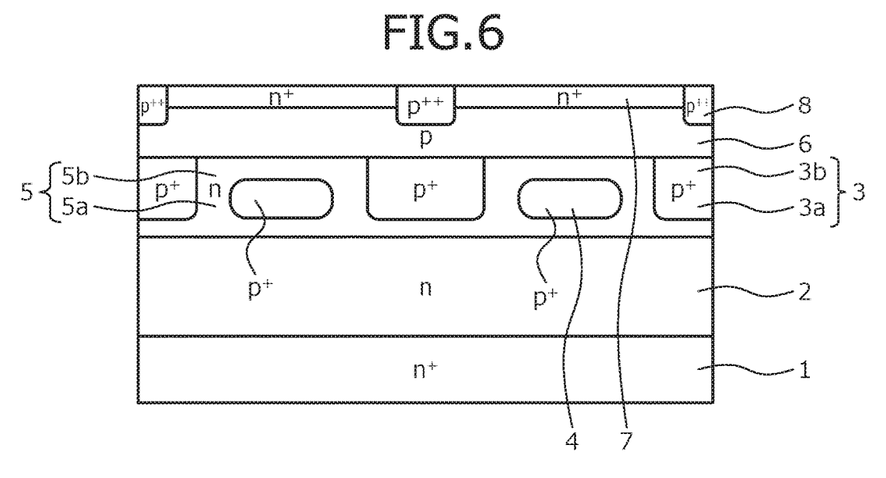
FIG. 6 is a cross-sectional view (part 4) of the silicon carbide semiconductor device according to the embodiment during manufacture.

Next, as depicted in FIG. 6, on the surface of the n-type silicon carbide epitaxial layer 2 (i.e., surfaces of the first $p^+$-type base regions 3 and the second n-type regions 5b), while a p-type impurity, e.g., aluminum atoms, is doped, the p-type base layer (wide bandgap semiconductor layer of the second conductivity type) 6 is formed by epitaxial growth and a thickness thereof is, for example, about 1.3 μm. Conditions of the epitaxial growth for forming the p-type base layers 6, for example, may be such that the concentration becomes about $4 \times 10^{17}/\text{cm}^3$, which is lower than the impurity concentration of the first $p^+$-type base region 3. By the processes up to here, the n-type silicon carbide epitaxial layer 2 and the p-type base layer 6 are stacked on the $n^+$-type silicon carbide substrate 1, forming the silicon carbide semiconductor base.

Next, on the surface of the p-type base layer 6, by photolithography, a mask (not depicted) having predetermined openings is formed using, for example, an oxide film. An n-type impurity, e.g., phosphorus (P) is ion implanted using the oxide film as a mask. As a result, as depicted in FIG. 6, in parts of the surface layer of the p-type base layer 6, the $n^+$ source region (source region of the first conductivity) 7 is formed. A dose amount at the time of the ion implantation for the $n^+$ source regions 7 may be set such that, for example, the impurity concentration becomes higher than the impurity concentration of the first $p^+$-type base region 3.

Next, the mask used in the ion implantation for the $n^+$ source regions 7 is removed. Subsequently, on the exposed surface of the p-type base layer 6, by photolithography, a mask (not depicted) having predetermined openings is formed using, for example, an oxide film and a p-type impurity, e.g., aluminum, is ion implanted in the surface of the p-type base layer 6, using the oxide film as a mask. As a result, as depicted in FIG. 6, in parts of a surface region of the p-type base layer 6, the $p^{++}$ contact region (contact region of the second conductivity) 8 is formed. A dose amount at the time of the ion implantation for the $p^{++}$ contact regions 8, for example, may be set so that the impurity concentration becomes higher than that of the second $p^+$-type base region 4. Next, the mask used in the ion implantation for the $p^{++}$ contact regions 8 is removed. The sequence of the ion implantation for the $n^+$ source regions 7 and the ion implantation for the $p^{++}$ contact regions 8 may be interchanged. The state up to here is depicted in FIG. 6.

Next, heat treatment (annealing) is performed and, for example, the first p-type regions 3a, the second p-type regions 3, the $n^+$ source regions 7, and the $p^{++}$ contact regions 8 are activated. A temperature of the heat treatment, for example, may be about 1700 degrees C. A period of the heat treatment, for example, may be about 2 minutes. As described, the ion implanted regions may be collectively activated by a single heat treatment session, or the heat treatment may be performed for activation each time the ion implantation is performed.

Figure 7:
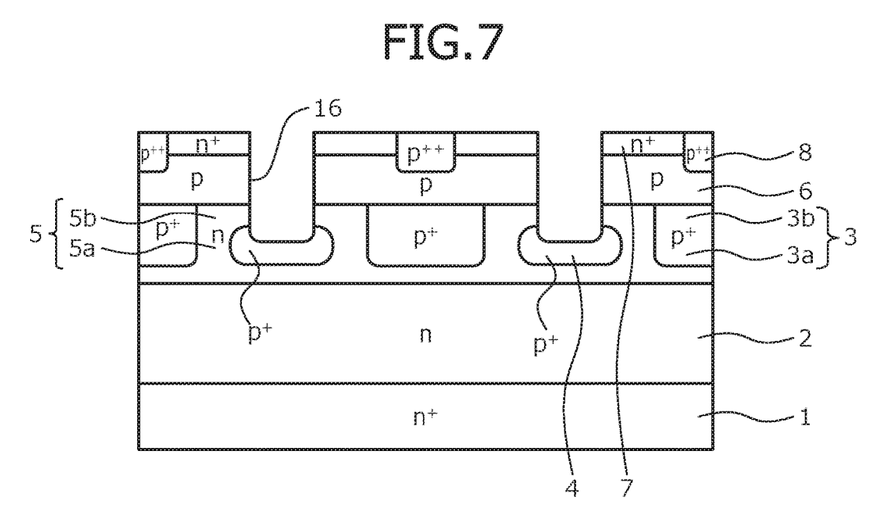
FIG. 7 is a cross-sectional view (part 5) of the silicon carbide semiconductor device according to the embodiment during manufacture.

Next, as depicted in FIG. 7, on the surface of the p-type base layer 6 (i.e., surfaces of the $n^+$ source regions 7 and the $p^{++}$ contact regions 8), by photolithography, a mask (not depicted) having predetermined openings is formed using, for example, an oxide film. By dry etching or the like using the oxide film as a mask, the trenches 16 are formed penetrating the $n^+$ source regions 7 and the p-type base layers 6 and reaching the n-type high-concentration regions 5. The bottoms of the trenches 16 may reach the second $p^+$-type base regions 4, or may be positioned in the n-type high-concentration regions 5 between the p-type base layers 6 and the second $p^+$-type base regions 4. Next, the mask used for forming the trenches 16 is removed. The state up to here is depicted in FIG. 7.

Figure 8:
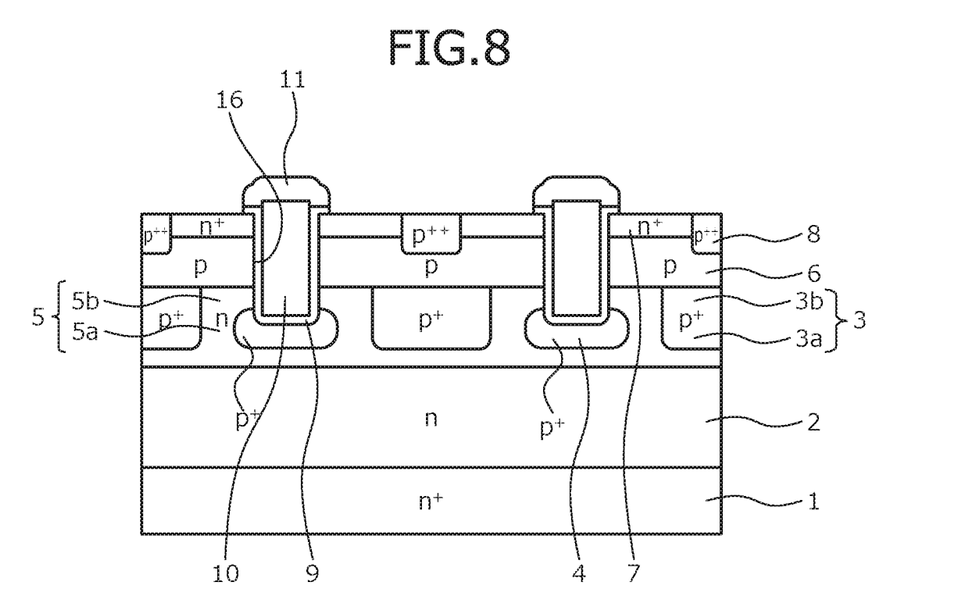
FIG. 8 is a cross-sectional view (part 6) of the silicon carbide semiconductor device according to the embodiment during manufacture.
Figure 9:
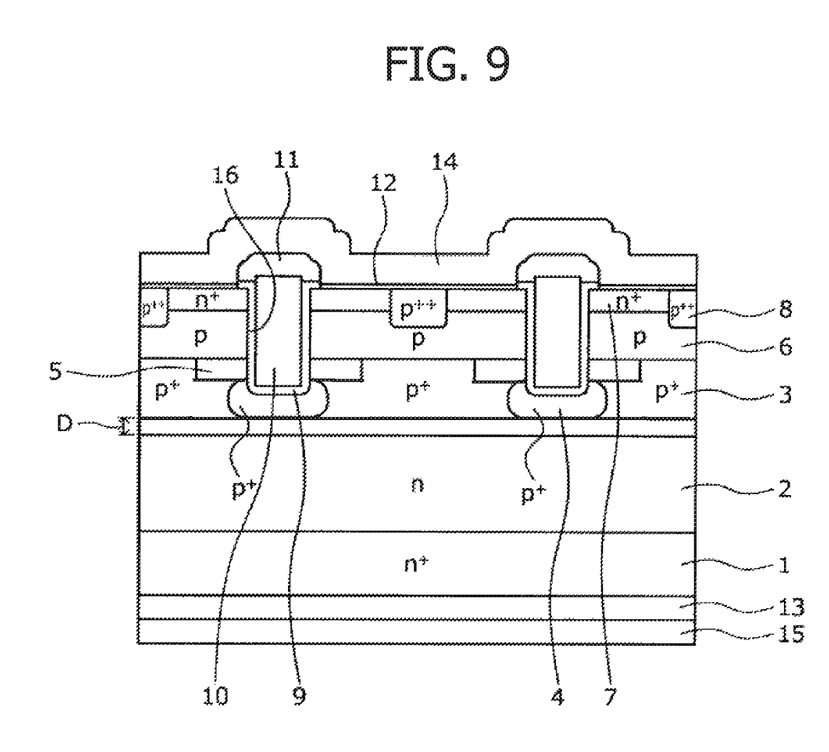
FIG. 9 is a cross-sectional view according to an embodiment.

Next, as depicted in FIG. 8, the gate insulating film 9 is formed along the surfaces of the $n^+$ source regions 7 and the $p^{++}$ contact regions 8, and along the bottoms and the side walls of the trenches 16. The gate insulating film 9 may be formed by thermal oxidation by heat treatment at a temperature of 1000 degrees C. in an oxygen atmosphere. Further, the gate insulating film 9 may be formed by a deposition method by a chemical reaction such as high temperature oxidation (High Temperature Oxide: HTO), etc.

Next, on the gate insulating film 9, a multi-crystal silicon layer is formed while, for example, phosphorus atoms are doped. The multi-crystal silicon layer is formed so as to be embedded in the trenches 16. The multi-crystal silicon layer is patterned and left in the trenches 16, whereby the gate electrodes 10 are formed. A part of the gate electrodes 10 may protrude from the tops of the trenches 16 (the source electrode pad 14 side) toward the source electrode pad 14.

Next, for example, phosphate glass is deposited to have a thickness of about 1 μm and so as to cover the gate insulating film 9 and the gate electrode 10 and thereby, form the interlayer insulating film 11. The interlayer insulating film 11 and the gate insulating film 9 are patterned and selectively removed, whereby contact holes are formed, exposing the $n^+$ source region 7 and the $p^{++}$ contact region 8. Thereafter, heat treatment (reflow) is performed, planarizing the interlayer insulating film 11. The state up to here is depicted in FIG. 8.

Next, as depicted in FIG. 1, the source electrode 12 is formed by, for example, sputtering, so as to contact the n$^+$ source region 7 and the p$^{++}$ contact region 8. Next, for example, an aluminum film is formed by, for example, sputtering to have a thickness of, for example, about 5 μm and so as to cover the source electrode 12 and the interlayer insulating film 11. Thereafter, the aluminum film is selectively removed so that a part that remains covers the active region of the elements overall, whereby the source electrode pad 14 is formed.

Next, the drain electrode 13 is formed on the second main surface of the n$^+$-type silicon carbide substrate 1 by, for example, sputtering. Next, on the surface of the drain electrode 13, for example, titanium (Ti), nickel (Ni), and gold (Au) are sequentially stacked whereby the drain electrode pad 15 is formed. In this manner, the semiconductor device depicted in FIG. 1 is completed.

In the embodiment, although a case where the second n-type region 5b is formed by ion implantation is shown, the second n-type silicon carbide epitaxial layer 2b may be formed as the second n-type region 5b. In other words, the impurity concentration of nitrogen at the time of epitaxial growth of the second n-type silicon carbide epitaxial layer 2b may be set so as to be the impurity concentration (about $5 \times 10^{16}/cm^3$) of the second n-type region 5b and the ion implantation may be omitted from the method of manufacture. Further, the n$^+$-type silicon carbide substrate 1 and the n-type silicon carbide epitaxial layer 2 may be collectively the silicon carbide semiconductor base; and in the surface layer of the base first main surface side of the n-type silicon carbide epitaxial layer 2, the p-type base layer 6 may be formed by ion implantation. Further, the n$^+$-type silicon carbide substrate 1 alone may be the silicon carbide semiconductor base, and in the surface layer of the first main surface side of the n$^+$-type silicon carbide substrate 1, all of the regions (including the n-type high-concentration region 5, and the first p$^+$-type base region 3 and the second p$^+$-type base region 4) constituting the MOS gate structure may be formed by ion implantation.

In the present invention, while a structure in which a first main surface of a silicon carbide substrate containing silicon carbide is a (0001) plane and a MOS gate structure is provided on the (0001) plane has been described as an example, without limitation hereto, the type of the wide bandgap semiconductor (for example, gallium nitride (GaN), etc.), the plane orientation of the main surface, etc. may be various changed.

Further, in the present invention, while in the embodiments, the first conductivity type is assumed as an n-type and the second conductivity type is assumed as a p-type, the present invention is similarly implemented when the first conductivity type is a p-type and the second conductivity type is an n-type.

As described, according to the embodiments, the first p$^+$-type base region is provided separated from the trench and in contact with the p-type base layer whereby between adjacent trenches, at a position deeper on the drain side than the bottom of the trench, the pn junction of the first p$^+$-type base region and the n-type drift layer may be formed. Further, in the n-type drift layer, the second p$^+$-type base region is provided so as to surround the bottom of the trench or to be deeper than the bottom of the trench and to face the trench in the depth direction, whereby the pn junction of the second p$^+$-type base region and the n-type drift layer may be formed at a position near the bottom of the trench. In this manner, the pn junctions between the n-type drift layer and the first p-type and the second p$^+$-type base regions are formed, whereby the application of a high electric field on the gate insulating film at the bottom of the trench may be prevented. As a result, even when a wide bandgap semiconductor is used as a semiconductor material, high-voltage capability becomes possible. Further, the second p$^+$-type base region having a width that is wider than that of the trench is provided, whereby the electric field at the corner portions of the bottom of the trench may be mitigated and whereby the breakdown voltage may be further increased. Even when the second p$^+$-type base region is arranged separated from the bottom of the trench in the depth direction, the ratio of the load of the electric field in the JFET region formed between the first p$^+$-type base region and the second p$^+$-type base region is increased, enabling the electric field at the bottom of the trench and the corner portions of the bottom to be mitigated.

Further, according to the embodiments, the high-concentration n-type drift layer that reaches a position deeper on the drain side than the first p-type and the second p$^+$-type base regions is provided between the first p-type and the second p$^+$-type base regions, whereby a high electric field is less likely to be applied to the gate insulating film at the side walls of the trench, even when the second p$^+$-type base region is provided near the bottom of the trench. Therefore, narrowing of the current path in the ON state may be suppressed, enabling increases in the ON resistance to be prevented. Accordingly, when breakdown voltage is high, the ON resistance may be lowered. Further, according to the embodiments, the first p$^+$-type base region may be formed at a position separated farther from the bottom of the trench in a horizontal direction (direction parallel to the substrate surface) compared to a conventional configuration (for example, Japanese Patent No. 5539931), whereby the trench and the first p$^+$-type base region may be formed at predetermined positions with good positional accuracy. Therefore, a high-voltage semiconductor device having a low ON resistance may be manufactured by a method of epitaxial growth and ion implantation or only ion implantation, a method easier than a conventional method. Even when the first p$^+$-type base region is formed at a position separated from the bottom of the trench in the horizontal direction, high voltage capability is made possible by the first p$^+$-type base region and the second p$^+$-type base region formed at a position near the trench.

According to the present invention, the depth of the region of the first conductivity type is deeper than the depth of the first base region of the second conductivity type and the second base region of the second conductivity type, whereby the ON resistance may be lowered when the breakdown voltage is high.

The semiconductor device and the method of manufacturing a semiconductor device according to the present invention achieves an effect in that by an easy method, the electric field at the fate insulating film at the bottom of the trench is mitigated and the breakdown voltage of the active region may be secured and the ON resistance may be lowered.

As described, the semiconductor device according to the present invention is useful for high-voltage semiconductor devices in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:

forming a first wide bandgap semiconductor layer of a first conductivity type on a front surface of a wide bandgap semiconductor substrate of the first conductivity type containing a semiconductor material having a bandgap wider than a bandgap of silicon, an impurity concentration of the first wide bandgap semiconductor layer of the first conductivity type being lower than an impurity concentration of the wide bandgap semiconductor substrate;

selectively forming a first base region of a second conductivity type and a second base region of the second conductivity type in a surface layer of the first wide bandgap semiconductor layer of the first conductivity type;

forming a first region of the first conductivity type in the surface layer of the first wide bandgap semiconductor layer of the first conductivity type, the first region of the first conductivity formed deeper than the first base region of the second conductivity type and the second base region of the second conductivity type;

forming a second wide bandgap semiconductor layer of the first conductivity type in a surface of the first wide bandgap semiconductor layer of the first conductivity type, the second wide bandgap semiconductor layer of the first conductivity type containing a semiconductor material having a bandgap wider than the bandgap of silicon, an impurity concentration of the second wide bandgap semiconductor layer of the first conductivity type being lower than the impurity concentration of the wide bandgap semiconductor substrate;

selectively forming a third base region of the second conductivity type in a surface layer of the second wide bandgap semiconductor layer of the first conductivity type, the third base region of the second conductivity type being in contact with the first base region of the second conductivity type;

forming a wide bandgap semiconductor layer of the second conductivity type in a surface of the second wide bandgap semiconductor layer of the first conductivity type, the wide bandgap semiconductor layer of the second conductivity type containing a semiconductor material having a bandgap wider than the bandgap of silicon;

selectively forming a source region of the first conductivity in the wide bandgap semiconductor layer of the second conductivity type;

forming a trench penetrating the source region of the first conductivity type and the wide bandgap semiconductor layer of the second conductivity type, and reaching the first region of the first conductivity;

forming a gate electrode in the trench via a gate insulating film;

forming an interlayer insulating film on the gate electrode;

forming a source electrode in contact with the wide bandgap semiconductor layer of the second conductivity type and the source region of the first conductivity; and forming a drain electrode on a rear surface of the wide bandgap semiconductor substrate.

2. The method according to claim 1, comprising:

selectively forming a second region of the first conductivity type in the surface layer of the second wide bandgap semiconductor layer of the first conductivity type, the second region of the first conductivity type being in contact with the first region of the first conductivity and being formed after formation of the third base region of the second conductivity type and before formation of the wide bandgap semiconductor layer of the second conductivity type.

3. The method according to claim 2, wherein
the second region of the first conductivity type is formed by ion implantation.

4. The method according to claim 1, wherein
the second wide bandgap semiconductor layer of the first conductivity type is formed to have an impurity concentration that is higher than the impurity concentration of the first wide bandgap semiconductor layer of the first conductivity type.

5. The method according to claim 1, wherein
the first wide bandgap semiconductor layer of the first conductivity type, the second wide bandgap semiconductor layer of the first conductivity type, and the wide bandgap semiconductor layer of the second conductivity type are formed by epitaxial growth.

6. The method according to claim 1, wherein
a depth of the first region of the first conductivity type is deeper than a depth of the first base region of the second conductivity type and the second base region of the second conductivity type by 0.2 μm to 0.5 μm.

7. The method according to claim 1, wherein
the semiconductor material having a bandgap wider than the bandgap of silicon is silicon carbide.